Inventor:
Dieter Gerstner
By: Spencer & Kaye
Attorneys

Inventor:
Dieter Gerstner
By: Spencer & Kaye
Attorneys

Nov. 5, 1968 D. GERSTNER 3,409,807

SEMICONDUCTOR ARRANGEMENT WITH CAPACITATIVE SHIELDING MEANS BETWEEN CONDUCTIVE STRIPS AND SEMICONDUCTOR BODY

Filed Jan. 7, 1965 3 Sheets-Sheet 3

Inventor:
Dieter Gerstner
By: Spencer & Kaye
Attorneys

United States Patent Office 3,409,807

Patented Nov. 5, 1968

3,409,807

SEMICONDUCTOR ARRANGEMENT WITH CAPACITATIVE SHIELDING MEANS BETWEEN CONDUCTIVE STRIPS AND SEMICONDUCTOR BODY

Dieter Gerstner, Heilbronn, Germany, assignor to Telefunken Patentverwertungsgesellschaft m.b.H., Ulm (Danube), Germany Filed Jan. 7, 1965, Ser. No. 424,089

Claims priority, application Germany, Jan. 8, 1964, T 25,387

4 Claims. (Cl. 317—234)

The present invention relates to a semiconductor arrangement, especially a transistor of a solid-state circuit, comprising conductive strips for establishing electrical contact to the semiconductor electrodes, which strips are separated from the surface of the semiconductor body by an insulating layer.

The making of contact to semiconductor electrodes by means of conductive strips is known to have the advantage that, despite the use of electrodes of small area, large contact areas are available if the conducting strips, or, in general, the ends of the conductive strips, have appropriately large contact areas. On the other hand, the large area portions of the conductive strips have an adverse influence on the high-frequency characteristics of the device because large-area portions of conductive strips result in relatively high capacitances.

It is, therefore, the primary object of the present invention to provide an arrangement which overcomes the above drawbacks, and, with this object in view, the present invention resides mainly in a semiconductor arrangement wherein the conductive strips for contacting the electrodes have portions spaced from the semiconductor body, and wherein metal shielding means are arranged between the semiconductor body and these spaced portions of the conductive strips.

Such shielding means of the conductive paths reduces the undesired capacitive effects of the conductive strip areas to a minimum. The term "conductive strip," as used throughout the instant specification and claims, is to be understood to include all parts which are interconnected so as to be electrically conductive and which are provided on an insulating layer on the semiconductor surface. For example, an electrical conductive strip includes the electrically conductive paths which lead from the electrodes to the contact-making areas, as well as the contact areas or patches themselves, the latter being in the form of widened portions of the strips at the ends thereof. The conductive strips may, however, comprise other widened portions as well.

If the semiconductor arrangement involves a transistor having a base, emitter and collector, the transistor will usually be connected in such a manner that one of the electrodes is common to the input and output circuits, i.e., there will be a so-called reference electrode, e.g., the base or emitter electrode, when the transistor is connected in common-base or common-emitter configuration. According to the present invention, the conductive strip associated with the reference electrode will be the one which serves as the capacitive shielding. That is to say, if the transistor is a planar or mesa transistor operated in common-base configuration, the conducting strip associated with the base electrode is used as a capacitive shielding, and as such is arranged between the semiconductor body and the conductive strip associated with the emitter electrode. On the other hand, if the same transistor is operated in common-emitter configuration, the conductive strip associated with the emitter electrode is used as capacitive shielding and is arranged between the semiconductor body and the conductive strip associated with the base electrode. The conductive strip serving as capacitive shielding is preferably larger in size than the other conductive strips.

Additional objects and advantages of the present invention will become apparent upon consideration of the following description when taken in conjunction with the accompanying drawings in which.

Figures 2, 2A:
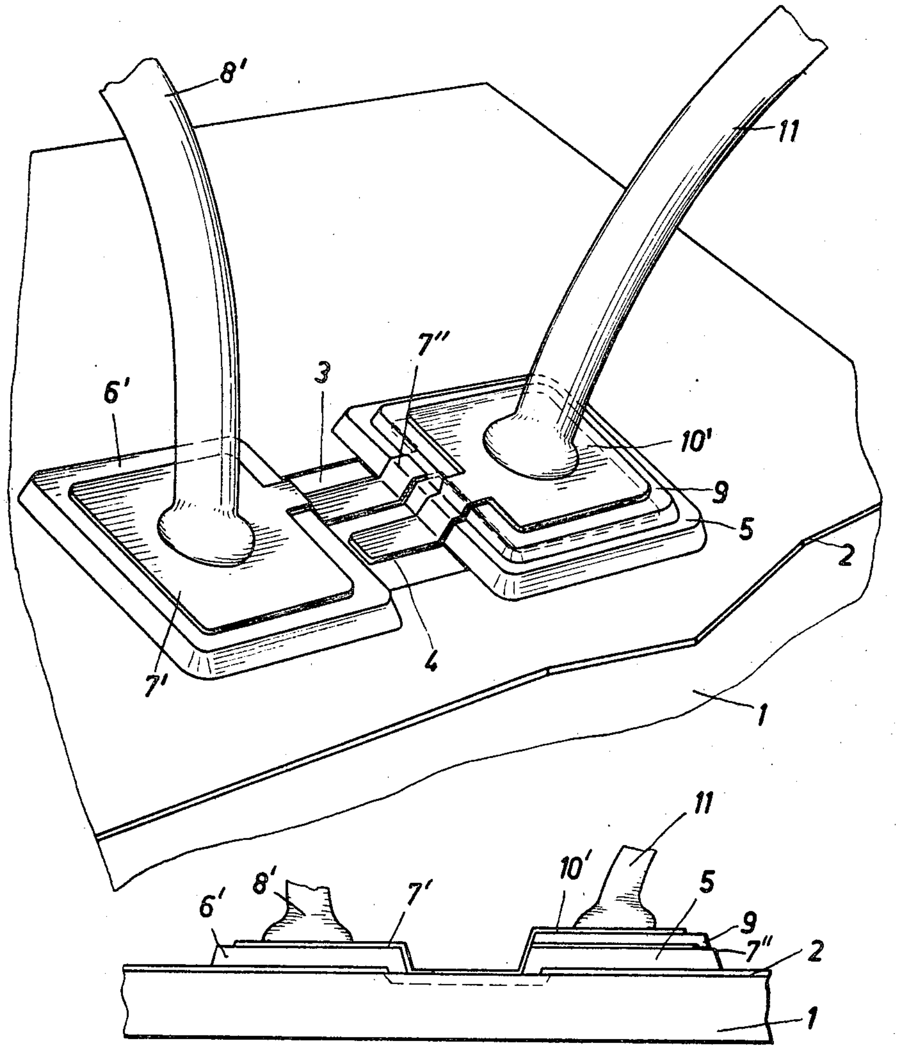
FIGURE 2 is a perspective view of another embodiment of a semiconductor arrangement according to the present invention.

FIGURE 2*a* is a side elevational view of the embodiment shown in FIGURE 2.

Figure 3:
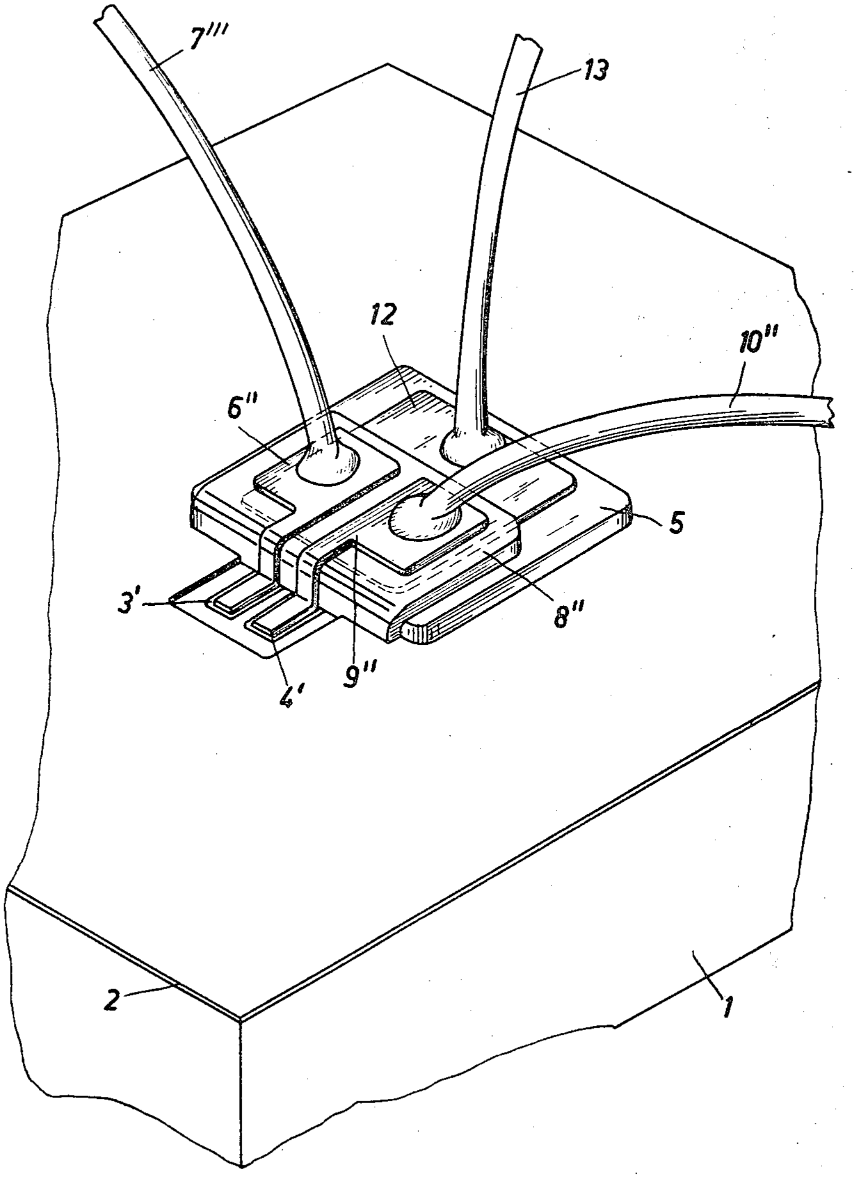

FIGURE 3 is a perspective view of still another embodiment of a semiconductor arrangement according to the present invention.

Figure 1:
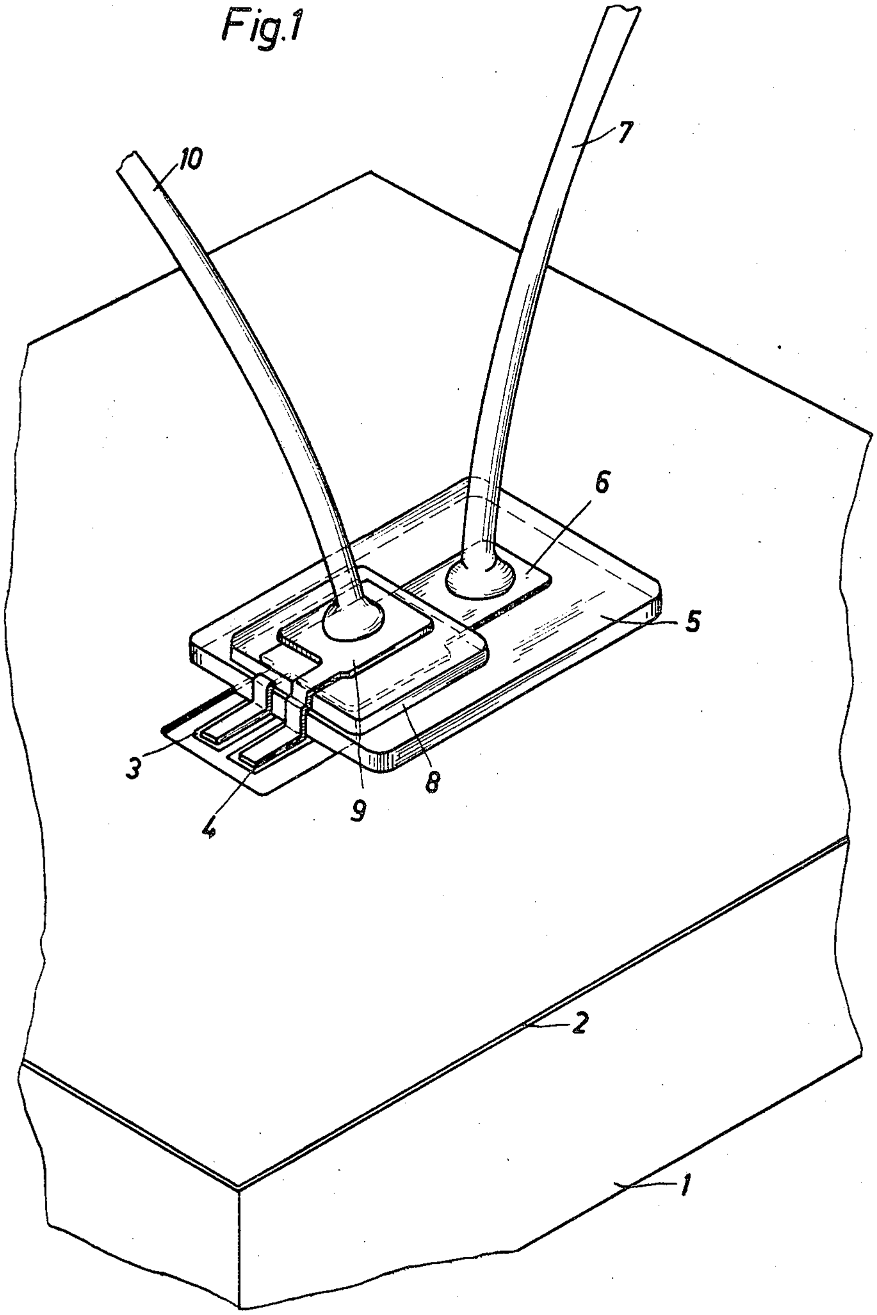
FIGURE 1 is a perspective view of one embodiment of a semiconductor arrangement according to the present invention.

Referring now to the drawings and first to FIGURE 1 thereof in particular, the same shows, by way of example, a planar transistor having a semiconductor body 1, whose surface is provided with an oxide layer 2, the same being applied in a manner known per se. The base electrode 3 and the emitter electrode 4 are produced in known manner by photolithographic processes as well as etching and diffusion or alloying processes.

According to the present invention, a first insulating patch 5 is vapor-deposited on the oxide layer 2 in order to reduce the capacitance between the collector body 1 and a conductive strip 6 provided on the patch 5. The conductive strip 6 establishes the electrically conductive connection between the base electrode and the lead wire 7. On top of this, a second insulating patch 8 is vapor-deposited in such a manner that it partially covers the conductive strip 6. On top of this, a conducting strip 9 is finally vapor-deposited, which strip establishes a conductive connection between the emitter electrode 4 and the lead wire 10.

If such a transistor is operated in common-base configuration, the base conductive strip 6 will be at ground potential. Since this conductive strip 6 is situated spatially between the collector 1 and the emitter conductive strip 9, no electric field lines can pass directly from the collector body 1 to the emitter conductive strip 9 so that the mutual influence, known as capacitive feedback, between the output (collector) and the input (emitter) of the transistor is very small. For this reason, relatively large contact areas can be used in the arrangement described without there being any unwanted feedback effects.

The arrangement shown in FIGURES 2 and 2*a* likewise relates to a planar transistor comprising a collector body 1, an $SiO_2$ covering layer 2, a base electrode 3 and an emitter electrode 4. The two insulating patches 5 and 6′ are applied to the semi-conductor surface by vapor deposition. The conductive strip 7′ is vapor-deposited on top so as to provide, on the one hand, a conductive connection between the base electrode 3 and the lead wire 8′ and, on the other hand, to form a capacitive shield by its extension 7″ on the insulating patch 5. Vapor-deposited on the insulating patch 5 with the conductive strip extension 7″ is a third insulating patch 9, and over that the emitter conductive strip 10′ which establishes a conductive connection between the emitter electrode 4 and the lead wire 11.

In the arrangement shown in FIGURE 3, a first insulating patch 5 is provided on the semiconductor body 1 with the oxide layer 2, on which patch there is a strip 12 forming a shield, which strip 12 is not connected to any of the semiconductor electrodes. This shield may be brought to any desired potential by means of the lead wire 13.

Above the insulating patch 5 and overlying the strip 12 is a further insulating patch 8″ on which are arranged the conductive strips 6″ and 9″ for making contact to the emitter and base electrodes 3' and 4'. The associated lead wires are designated by 7''' and 10''.

Although the invention has only been explained with reference to an individual element as an example of an embodiment, the use of a plurality of conductive strips one above the other in accordance with the invention is applicable for use in multiple systems and particularly for solid-state circuits comprising a plurality of active and passive elements, i.e., integrated circuits.

It will be seen that, in accordance with the present invention, there is provided a semiconductor arrangement which comprises a semiconductor body having a plurality of electrodes, wherein conductive strips are provided for contacting the electrodes, these strips having portions which are spaced from the semiconductor body. The metal shielding means which are arranged between the semiconductor body and these spaced portions of the conductive strips allow the individual conductive strips to be made relatively large at least in certain regions without creating the problem of producing excessively large capacitances.

The insulating layers which are applied to the semiconductor body, to the electrodes, or to the conductive strips may, for example, be vapor deposited, and be made of SiO or $SiO_2$, or they may be provided by decomposing a compound containing silicon, such as silicon tetra ethyl ester.

It will be understood that the above description of the present invention is susceptible to various modifications, changes and adaptations, and the same are intended to be comprehended within the meaning and range of equivalents of the appended claims.

What is claimed is:

1. A semiconductor arrangement comprising, in combination:

(a) a semiconductor transistor body having emitter, collector and base electrodes;

(b) an insulating layer covering said transistor body;

(c) a metallic coating on said insulating layer;

(d) a further insulating layer on said metallic coating; and (e) two conductive strips for contacting two of said electrodes, each conductive strip having a portion lying on said further insulating layer, said metallic coating between said two insulating layers thus acting as a means forming a capacitative shield between said portions of said two conductive strips and said transistor body.

2. A semiconductor arrangement as defined in claim 1, further comprising means for applying a desired potential to said shielding means.

3. A semiconductor arrangement as defined in claim 1 wherein the electrodes which said two conductive strips contact are those which are not common to the input and output circuits of said transistor.

4. A semiconductor arrangement as defined in claim 1 wherein each of said insulating layers is an oxide of the material of which said semiconductor body is made.

References Cited

UNITED STATES PATENTS

| | | | |
|---|---|---|---|
| 2,981,877 | 4/1961 | Noyce | 317—235 |
| 3,138,744 | 6/1964 | Kilby | 317—101 |
| 3,237,271 | 3/1966 | Arnold et al. | 29—25.3 |
| 3,254,276 | 5/1966 | Schwarz et al. | 317—235 |
| 3,257,588 | 6/1966 | Mueller | 317—234 |
| 2,878,399 | 3/1959 | Lair | 317—236 |

FOREIGN PATENTS 954,534 4/1964 Great Britain.

JOHN W. HUCKERT, *Primary Examiner.*

R. F. POLISSACK, *Assistant Examiner.*